US012805111B2

(12) United States Patent
Hu

(10) Patent No.: US 12,805,111 B2
(45) Date of Patent: Nov. 17, 2026

(54) FLEXIBLE DISPLAY MODULE AND DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Li Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 697 days.

(21) Appl. No.: 17/595,948

(22) PCT Filed: Sep. 24, 2021

(86) PCT No.: PCT/CN2021/120215

§ 371 (c)(1),
(2) Date: Jun. 20, 2024

(87) PCT Pub. No.: WO2023/035335

PCT Pub. Date: Mar. 16, 2023

(65) Prior Publication Data

US 2024/0334720 A1 Oct. 3, 2024

(30) Foreign Application Priority Data

Sep. 13, 2021 (CN) ......................... 202111066657.4

(51) Int. Cl.
*H10K 39/38* (2026.01)
*H10K 39/34* (2023.01)
(Continued)

(52) U.S. Cl.
CPC ............. *H10K 39/38* (2023.02); *H10K 39/34* (2023.02); *H10K 59/131* (2023.02); *H10K 2102/311* (2023.02); *H10W 90/00* (2026.01)

(58) Field of Classification Search
CPC ...... H10K 39/38; H10K 59/131; H10K 39/34; H10K 2102/311; H10W 90/00
See application file for complete search history.

(56) References Cited

U.S. PATENT DOCUMENTS

2018/0052493 A1 2/2018 Hong et al.
2020/0067000 A1* 2/2020 Li ........................ H10K 59/131
(Continued)

FOREIGN PATENT DOCUMENTS

CN 109886140 A 6/2019
CN 110047380 A 7/2019
(Continued)

OTHER PUBLICATIONS

International Search Report in International application No. PCT/CN2021/120215,mailed on Jun. 13, 2022.
(Continued)

*Primary Examiner* — Robert J Michaud

(57) ABSTRACT

A flexible display module and a display terminal are provided. The flexible display module includes a plurality of island-shaped structures, a plurality of electrical connection structures, and a plurality of photosensitive structures. Two adjacent island-shaped structures are stretched and connected by the plurality of electrical connection structures. Each of the photosensitive structures is disposed between two adjacent island-shaped structures. The photosensitive structures are disposed on a side of the island-shaped structures away from a light-emitting direction of the flexible display module.

20 Claims, 7 Drawing Sheets

(51) Int. Cl.
*H10K 59/131* (2023.01)
*H10K 102/00* (2023.01)
*H10W 90/00* (2026.01)

(56) References Cited

U.S. PATENT DOCUMENTS

| | | | | |
|---|---|---|---|---|
| 2020/0111851 | A1 | 4/2020 | Park et al. | |
| 2024/0381737 | A1* | 11/2024 | Ikeda | H05B 33/12 |

FOREIGN PATENT DOCUMENTS

| | | | |
|---|---|---|---|
| CN | 110797379 | A | 2/2020 |
| CN | 110851028 | A | 2/2020 |
| CN | 112397457 | A | 2/2021 |
| CN | 112397559 | A | 2/2021 |
| CN | 112563308 | A | 3/2021 |
| CN | 112768616 | A | 5/2021 |

OTHER PUBLICATIONS

Written Opinion of the International Search Authority in International application No. PCT/CN2021/120215,mailed on Jun. 13, 2022.

Chinese Office Action issued in corresponding Chinese Patent Application No. 202111066657.4 dated Apr. 9, 2023, pp. 1-7.

* cited by examiner

FLEXIBLE DISPLAY MODULE AND DISPLAY TERMINAL

TECHNICAL FIELD

The present disclosure relates to the field of displays, and more particularly to a flexible display module and a display terminal.

BACKGROUND

At present, main fingerprint identification technologies used in industries are a capacitive fingerprint identification technology and a photosensitive fingerprint scanning technology. The capacitive fingerprint identification technology detects positions of ridges and valleys of a finger according to a magnitude of a capacitance formed between the ridges and valleys of the finger and sensing electrodes, thereby forming fingerprint image information. The photosensitive fingerprint scanning technology obtains information of a reflected light from a surface of a finger through a photosensitive element, and complete fingerprint imaging information is finally synthesized.

With the development of full-screen mobile phones, in the current fingerprint identification technology, it is necessary to separately set hardware devices (such as, tactile switches, capacitive elements, and fingerprint identification sensors) at fingerprint touch positions. Also, the fingerprint identification of this technology cannot be performed in a display area, and fingerprints can only be identified in a fixed area, so full-screen fingerprints cannot be realized.

Therefore, it is necessary to provide a flexible display module and a display terminal to solve the above technical problems.

SUMMARY OF THE DISCLOSURE

Technical Problem

The present disclosure provides a flexible display module and a display terminal to improve technical problems that a full-screen fingerprint identification cannot be realized in existing display devices.

Solutions to the Problem

Technical Solutions

The present disclosure provides a flexible display module, including:

a plurality of island-shaped structures, where each of the island-shaped structures includes a light-emitting unit, and the plurality of island-shaped structures are separated from each other;

a plurality of electrical connection structures, where the electrical connection structures include metal lines configured to electrically connect the light-emitting units, and two adjacent island-shaped structures are stretched and connected by the plurality of electrical connection structures; and a plurality of photosensitive structures, where each of the photosensitive structures is disposed between two adjacent island-shaped structures, and the photosensitive structures are disposed on one side of the island-shaped structures away from a light-emitting direction of the flexible display module.

In the flexible display module of the present disclosure, in response to the flexible display module being in an unstretched state, the photosensitive structure includes a first overlapping portion overlapping with the island-shaped structure. In response to the flexible display module being in a stretched state, the photosensitive structure includes a second overlapping portion overlapping with the island-shaped structure.

In a top view of the flexible display module, an area of the first overlapping portion is greater than an area of the second overlapping portion.

In the flexible display module of the present disclosure, the flexible display module further includes a photosensitive functional layer and a stretched functional layer disposed on the photosensitive functional layer. The photosensitive functional layer includes the plurality of photosensitive structures, and the stretched functional layer includes the plurality of island-shaped structures and a first flexible adhesive layer disposed between the plurality of island-shaped structures.

In response to the flexible display module being in an unstretched state, an orthographic projection of the first flexible adhesive layer disposed between the plurality of island-shaped structures on the photosensitive structures is within the photosensitive structures, or in response to the flexible display module being in the unstretched state, an orthographic projection of the photosensitive structures on the stretched functional layer is within the first flexible adhesive layer between the plurality of island-shaped structures.

In response to the flexible display module being in a stretched state, the orthographic projection of the first flexible adhesive layer disposed between the plurality of island-shaped structures on the photosensitive structures is within the photosensitive structures, or in response to the flexible display module being in the stretched state, the orthographic projection of the photosensitive structures on the stretched functional layer is within the first flexible adhesive layer between the plurality of island-shaped structures.

In the flexible display module of the present disclosure, the photosensitive structure includes a first flexible substrate, a photosensitive unit disposed on the first flexible substrate, and a light filter unit disposed on the photosensitive unit.

The photosensitive unit includes a first array driving layer and a photosensitive device disposed on the first array driving layer, the photosensitive device includes a first cathode layer, a photosensitive device, and a first anode layer, the first cathode layer is electrically connected to the first array driving layer, the photosensitive device is disposed on the first cathode layer, the first anode layer is disposed on the photosensitive layer.

In the flexible display module of the present disclosure, the first array driving layer further includes a first active layer, a first gate layer disposed on the first active layer, and a first source-drain layer disposed on the first gate layer, and the first source-drain layer includes a first electrode block electrically connected to the first cathode layer.

The first array driving layer further includes a second electrode block arranged on a same layer as the first gate layer, and the first electrode block and the second electrode block are configured as a storage capacitor.

The storage capacitor is connected in parallel with a light reflecting device, and the second electrode block is electrically connected with the first anode layer.

In the flexible display module of the present disclosure, the light filter unit includes one of a red light filter unit, a green light filter unit, and a blue light filter unit.

In the flexible display module of the present disclosure, the stretched functional layer further includes a second flexible adhesive layer disposed on both sides of the plurality of island-shaped structures, and the first flexible adhesive layer and the second flexible adhesive layer are integrated.

The plurality of island-shaped structures are embedded in a flexible protective layer configured by the first flexible adhesive layer and the second flexible adhesive layer.

In the flexible display module of the present disclosure, the island-shaped structure includes:

a second flexible substrate;

a second array driving layer disposed on the second flexible substrate; and a light-emitting functional layer disposed on the second array driving layer, where the light-emitting functional layer includes a plurality of the light-emitting units, and the light-emitting units are electrically connected to sources and drains in the second array driving layer.

In the flexible display module of the present disclosure, the stretched functional layer further includes a flexible encapsulation layer disposed on at least one side of the second flexible adhesive layer, and material of the flexible encapsulation layer includes polydimethylsiloxane.

In the flexible display module of the present disclosure, a distribution density of the photosensitive structures and a distribution density of the island-shaped structures are the same.

In the flexible display module of the present disclosure, the plurality of electrical connection structures includes a plurality of bending structures, the bending structures include at least a first bending portion and a second bending portion, one end of the first bending portion is electrically connected to a first island-shaped structure, another end of the first bending portion is electrically connected to one end of the second bending portion, and another end of the second bending portion is electrically connected to a second island-shaped structure. The first island-shaped structure is adjacent to the second island-shaped structure.

A bending direction of the first bending portion is different from a bending direction of the second bending portion.

In the flexible display module of the present disclosure, the light-emitting unit includes a first color sub-pixel, a second color sub-pixel, and a third color sub-pixel, and an area of the third color sub-pixel is greater than an area of the first color sub-pixel or an area of the second color sub-pixel.

In the flexible display module of the present disclosure, the light-emitting unit includes a first sub-pixel, a second sub-pixel, a third sub-pixel, and a fourth sub-pixel, the first sub-pixel corresponds to a first color sub-pixel, the second sub-pixel corresponds to a second color sub-pixel, and the third sub-pixel and the fourth sub-pixel correspond to a third color sub-pixel.

In the flexible display module of the present disclosure, the bending structure includes:

a second flexible substrate;

a flexible filling layer disposed on the second flexible substrate;

a wiring layer disposed on the flexible filling layer; and a second flexible adhesive layer disposed on the wiring layer.

The wiring layer includes at least a plurality of metal lines, and two adjacent metal lines are arranged in parallel and equidistantly.

In the flexible display module of the present disclosure, the plurality of metal lines include at least a data line, a gate line, a driving voltage line, and a voltage transmission line.

The present disclosure also provides a display terminal, including a terminal body and a flexible display module. The terminal body and the flexible display module are assembled as one piece. The flexible display module includes:

a plurality of island-shaped structures, where each of the island-shaped structures includes a light-emitting unit, and the plurality of island-shaped structures are separated from each other;

a plurality of electrical connection structures, where the electrical connection structures include metal lines configured to electrically connect the light-emitting units, and two adjacent island-shaped structures are stretched and connected by the plurality of electrical connection structures; and a plurality of photosensitive structures, where each of the photosensitive structures is disposed between two adjacent island-shaped structures, and the photosensitive structures are disposed on one side of the island-shaped structures away from a light-emitting direction of the flexible display module.

In the display terminal of the present disclosure, in response to the flexible display module being in an unstretched state, the photosensitive structure includes a first overlapping portion overlapping with the island-shaped structure. In response to the flexible display module being in a stretched state, the photosensitive structure includes a second overlapping portion overlapping with the island-shaped structure.

In a top view of the flexible display module, an area of the first overlapping portion is greater than an area of the second overlapping portion.

In the display terminal of the present disclosure, the flexible display module further includes a photosensitive functional layer and a stretched functional layer disposed on the photosensitive functional layer, the photosensitive functional layer includes the plurality of photosensitive structures, and the stretched functional layer includes the plurality of island-shaped structures and a first flexible adhesive layer disposed between the plurality of island-shaped structures.

In response to the flexible display module being in an unstretched state, an orthographic projection of the first flexible adhesive layer disposed between the plurality of island-shaped structures on the photosensitive structures is within the photosensitive structures, or in response to the flexible display module being in the unstretched state, an orthographic projection of the photosensitive structures on the stretched functional layer is within the first flexible adhesive layer between the plurality of island-shaped structures.

In response to the flexible display module being in a stretched state, the orthographic projection of the first flexible adhesive layer disposed between the plurality of island-shaped structures on the photosensitive structures is within the photosensitive structures, or in response to the flexible display module being in the stretched state, the orthographic projection of the photosensitive structures on the stretched functional layer is within the first flexible adhesive layer between the plurality of island-shaped structures.

In the display terminal of the present disclosure, the photosensitive structure includes a first flexible substrate, a photosensitive unit disposed on the first flexible substrate, and a light filter unit disposed on the photosensitive unit.

The photosensitive unit includes a first array driving layer and a photosensitive device disposed on the first array driving layer, the photosensitive device includes a first cathode layer, a photosensitive device, and a first anode layer, the first cathode layer is electrically connected to the first array driving layer, the photosensitive device is disposed on the first cathode layer, the first anode layer is disposed on the photosensitive layer.

In the display terminal of the present disclosure, the stretched functional layer further includes a second flexible adhesive layer disposed on both sides of the plurality of island-shaped structures, and the first flexible adhesive layer and the second flexible adhesive layer are integrated.

The plurality of island-shaped structures are embedded in a flexible protective layer configured by the first flexible adhesive layer and the second flexible adhesive layer.

Beneficial Effects of the Disclosure

Beneficial Effects

The present disclosure provides the flexible display module and the display terminal. The flexible display module includes the plurality of island-shaped structures, the plurality of electrical connection structures, and the plurality of photosensitive structures. Two adjacent island-shaped structures are stretched and connected by the plurality of electrical connection structures. Each of the photosensitive structures is disposed between two adjacent island-shaped structures, and the photosensitive structures are disposed on one side of the island-shaped structures away from a light-emitting direction of the flexible display module. In the present disclosure, the photosensitive structure is disposed between two adjacent light-emitting units, so that the photosensitive structures are arranged according to an arrangement of the light-emitting units. It is ensured that the photosensitive structures are corresponding disposed on anywhere in a display area, and a full-screen arrangement of a fingerprint identification structure is realized.

BRIEF DESCRIPTION OF DRAWINGS

Description of Drawings

Figure 1:
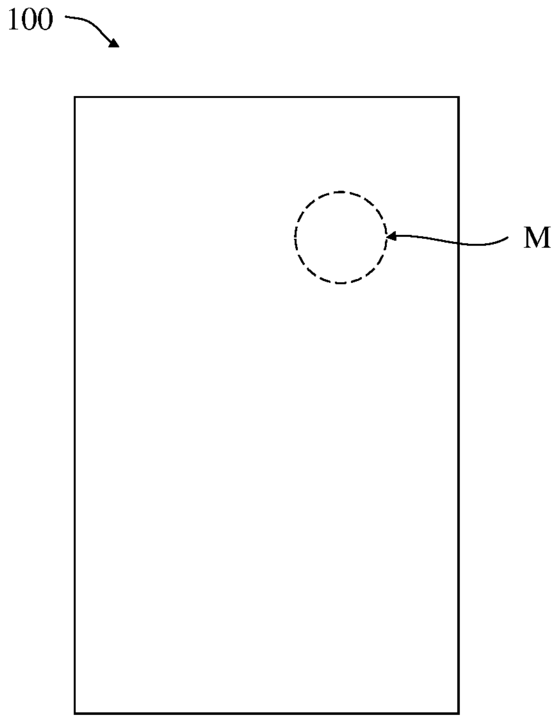

FIG. 1 is a top view of a flexible display module of the present disclosure.

Figure 2:
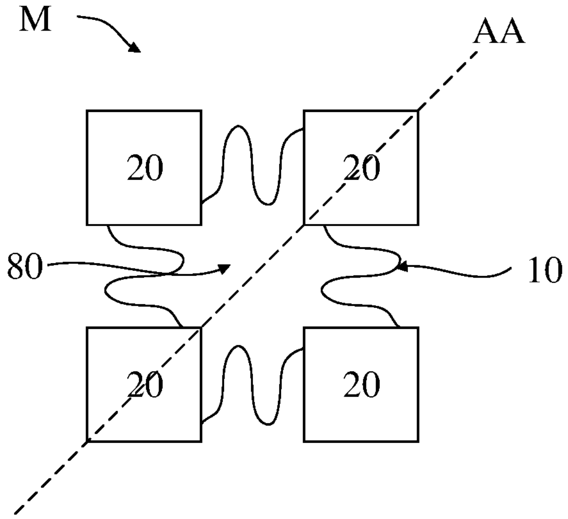

FIG. 2 is a first enlarged view of a region M in FIG. 1.

Figure 3:
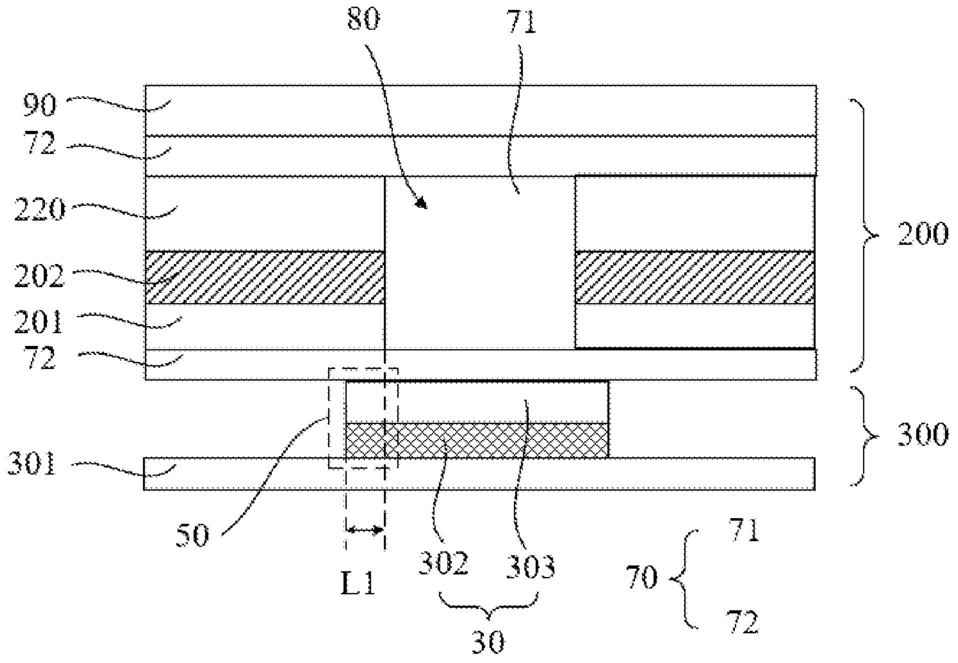

FIG. 3 is a cross-sectional view taken along section line AA in FIG. 2.

Figure 4:
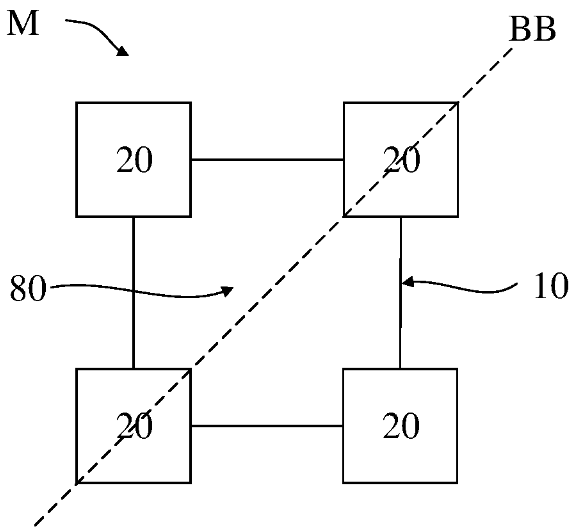

FIG. 4 is a second enlarged view of a region M in FIG. 1.

Figure 5:
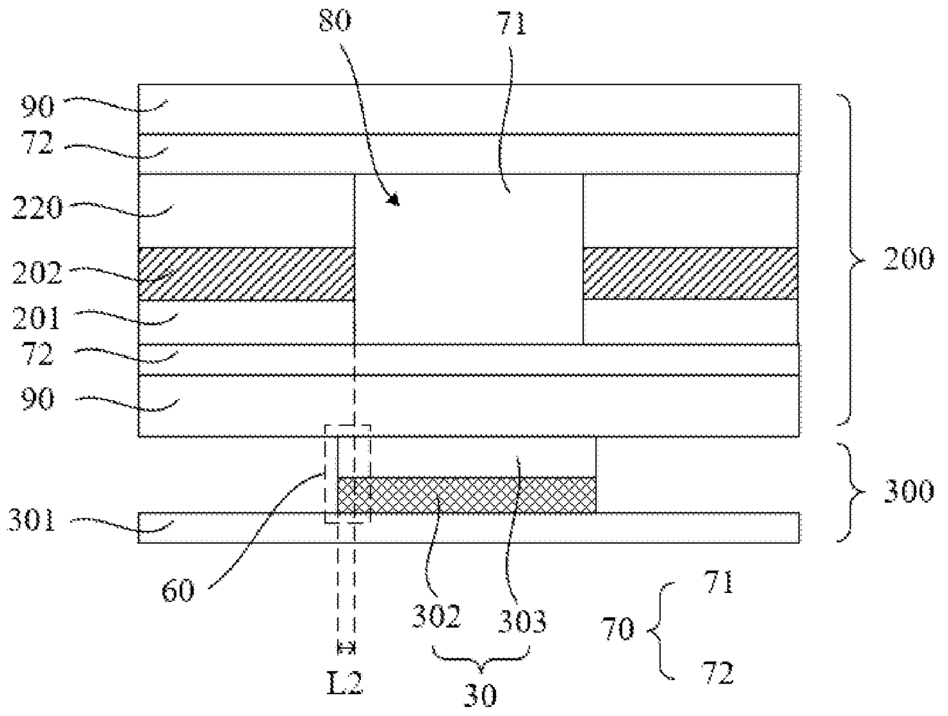

FIG. 5 is a first cross-sectional view taken along section line BB in FIG. 4.

Figure 6:
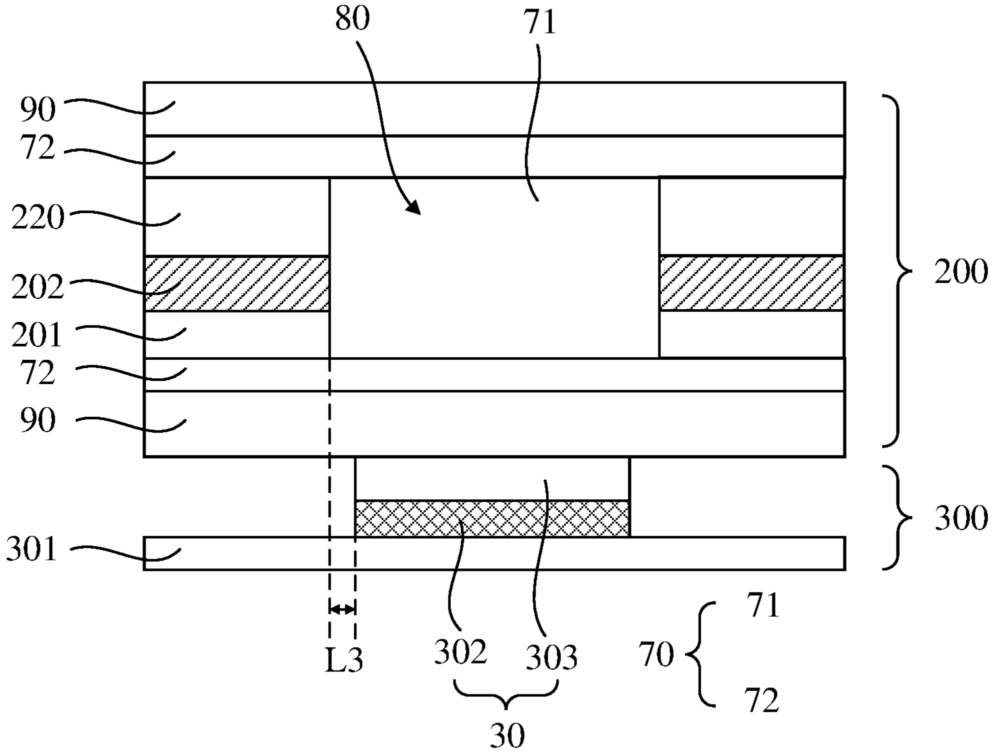

FIG. 6 is a second cross-sectional view taken along section line BB in FIG. 4.

Figure 7:
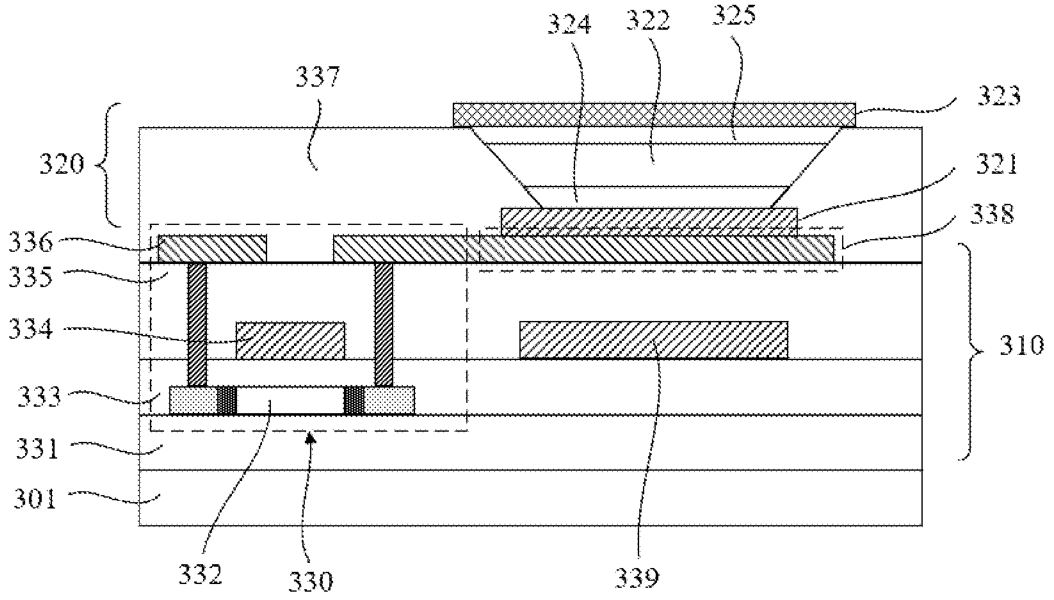

FIG. 7 is a cross-sectional view of a photosensitive structure in a flexible display module of the present disclosure.

Figure 8:
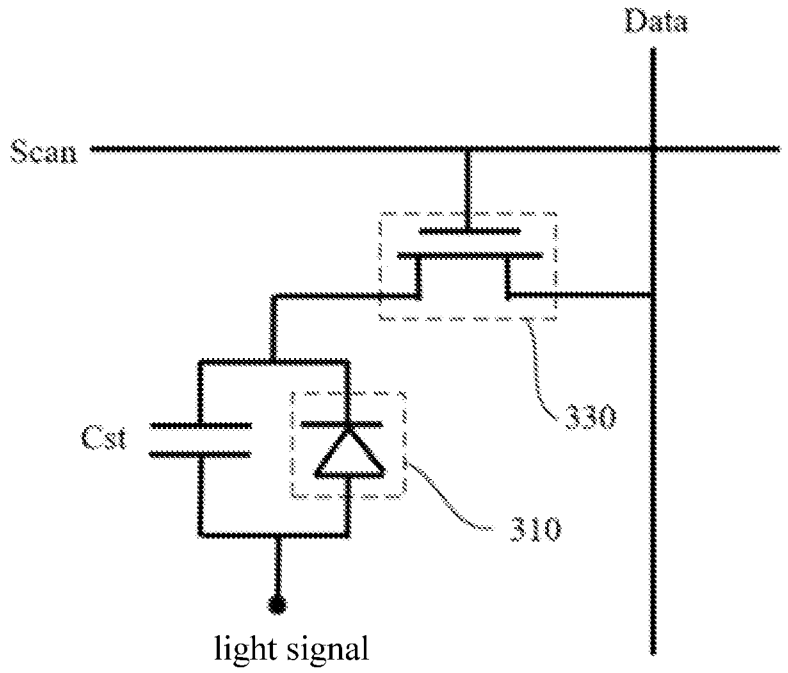

FIG. 8 is an equivalent circuit diagram of the photosensitive structure in FIG. 7.

Figure 9:
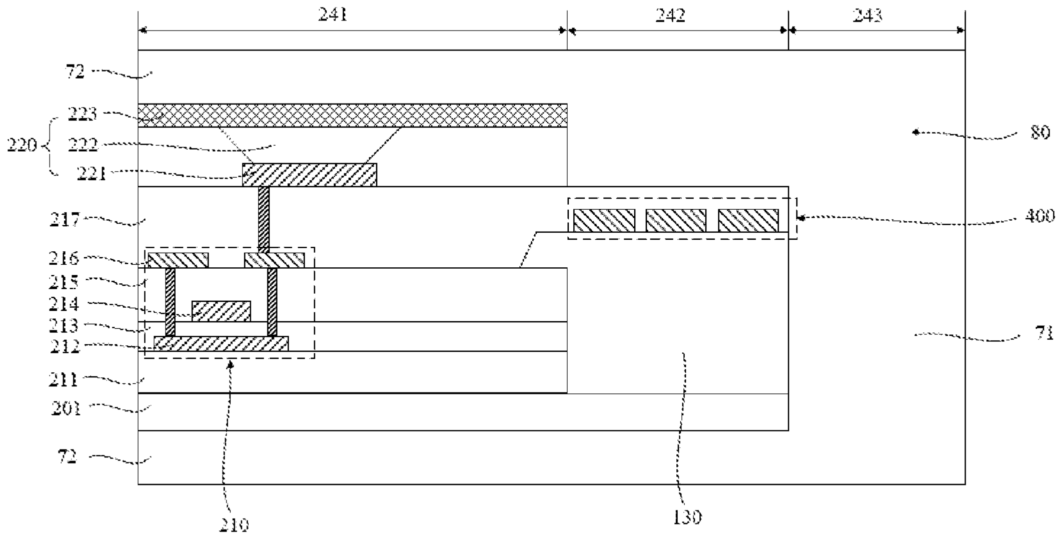

FIG. 9 is a first cross-sectional view of an island-shaped structure in a flexible display module of the present disclosure.

Figure 10:
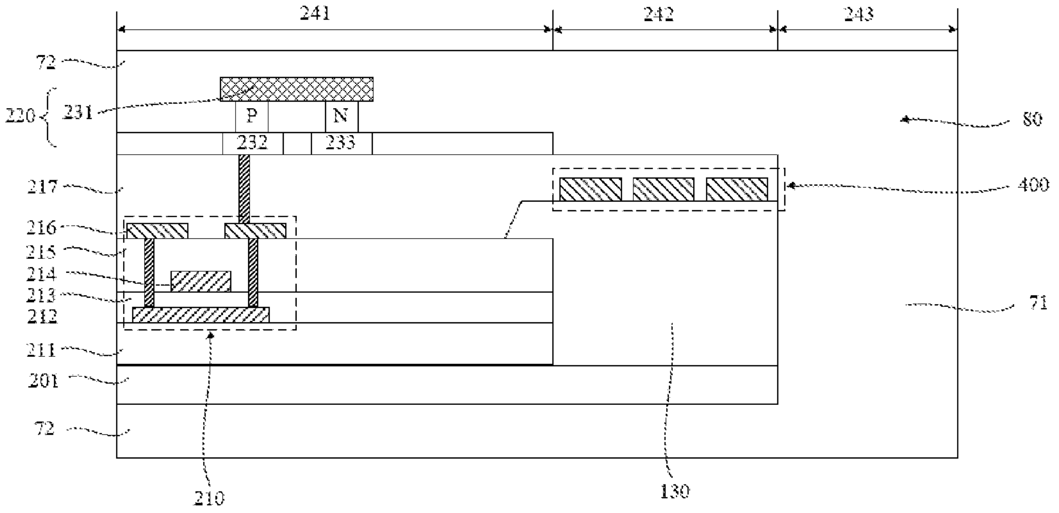

FIG. 10 is a second cross-sectional view of an island-shaped structure in a flexible display module of the present disclosure.

Figure 11:
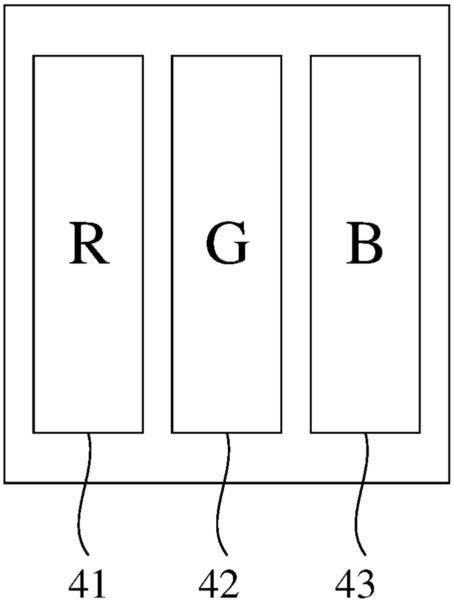

FIG. 11 is schematic diagram showing a first arrangement of sub-pixels of light-emitting units in a flexible display module of the present disclosure.

Figure 12:
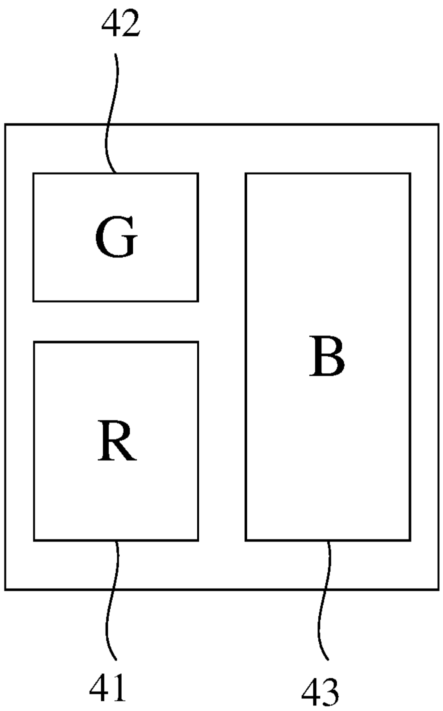

FIG. 12 is schematic diagram showing a second arrangement of sub-pixels of light-emitting units in a flexible display module of the present disclosure.

Figure 13:
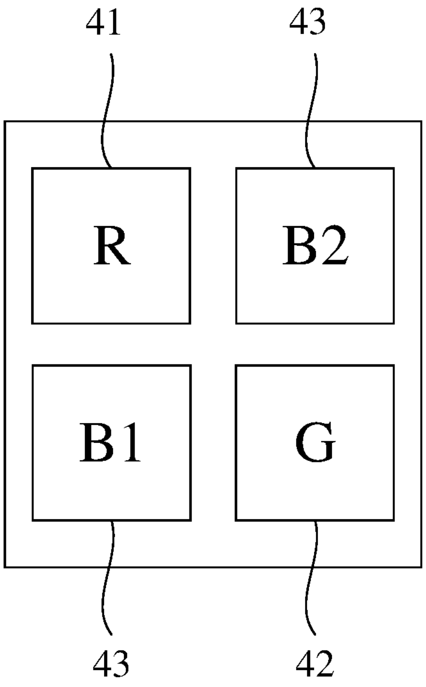

FIG. 13 is schematic diagram showing a third arrangement of sub-pixels of light-emitting units in a flexible display module of the present disclosure.

Figure 14:
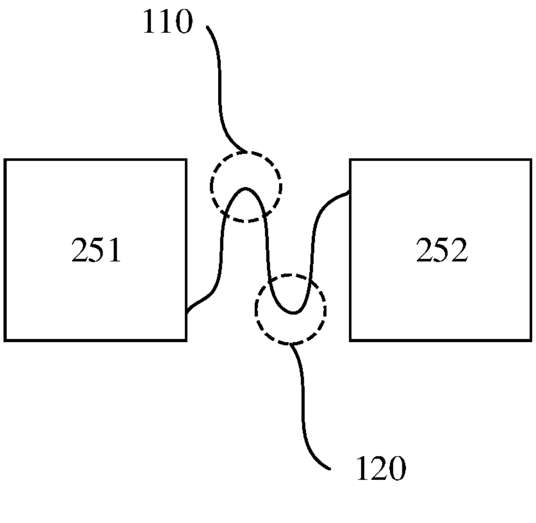

FIG. 14 is a third enlarged view of a region M in FIG. 1.

DETAILED DESCRIPTION

Embodiments of the Disclosure

In order to make purposes, technical solutions, and effects of the present disclosure clearer and specific, the present disclosure will be further described in detail below with reference to accompanying drawings and embodiments. It should be understood that the specific embodiments described herein are only used to explain the present disclosure, and are not used to limit the present disclosure.

In a current fingerprint identification technology, it is necessary to separately set hardware devices (such as, tactile switches, capacitive elements, and fingerprint identification sensors) at fingerprint touch positions. Also, the fingerprint identification of this technology cannot be performed in a display area, and fingerprints can only be identified in a fixed area, so full-screen fingerprints cannot be realized. The present disclosure provides the following technical solutions to solve the above technical problems.

Referring to FIG. 1 to FIG. 13, the present disclosure provides a flexible display module 100, which includes:

- a plurality of island-shaped structures 20, where each of the island-shaped structures 20 includes a light-emitting unit, and the plurality of island-shaped structures 20 are separated from each other;
- a plurality of electrical connection structures 10, where the electrical connection structures 10 include metal lines configured to electrically connect the light-emitting units, and two adjacent island-shaped structures 20 are stretched and connected by the plurality of electrical connection structures 10; and
- a plurality of photosensitive structures 30, where each of the photosensitive structures 30 is disposed between two adjacent island-shaped structures 20, and the photosensitive structures 30 are disposed on one side of the island-shaped structures 20 away from a light-emitting direction of the flexible display module 10.

The present disclosure provides the flexible display module 100 and a display terminal. The flexible display module 100 includes the plurality of island-shaped structures 20, the plurality of electrical connection structures 10, and the plurality of photosensitive structures 30. Two adjacent island-shaped structures 20 are stretched and connected by the plurality of electrical connection structures 10. Each of the photosensitive structures 30 is disposed between two adjacent island-shaped structures 20. The photosensitive structures 30 are disposed on the side of the island-shaped structures 20 away from the light-emitting direction of the flexible display module 100. In the present disclosure, each of the photosensitive structures 30 is arranged between two adjacent light-emitting units, so that the photosensitive structures 30 are arranged according to an arrangement of the light-emitting units. It is ensured that the photosensitive structures 30 are corresponding disposed on anywhere in a display area. In comparison with a fingerprint identification structure in the prior art, a full-screen arrangement of a fingerprint identification structure is employed in the present disclosure.

In this embodiment, the photosensitive structures 30 may be optical fingerprint identification modules. When a user performs a fingerprint identification, a light emitted by the light-emitting unit is reflected by ridges and valleys of a finger, and enters the photosensitive structures 30 through small holes formed between the adjacent island-shaped structures 20. According to a difference of light intensities received by photosensitive structures 30, it is transformed into different electrical signals to realize the corresponding fingerprint identification.

The technical solutions of the present disclosure will now be described in conjunction with specific embodiments.

Referring to FIG. 2 and FIG. 3, FIG. 2 is a first enlarged view of a region M in FIG. 1, and FIG. 3 is a cross-sectional view taken along section line AA in FIG. 2. FIG. 2 and FIG. 3 are structural diagrams showing the flexible display module 100 is in an unstretched state. That is, the flexible display module 100 is in a state where it is not touched by the user. At this time, the photosensitive structure 30 may include a first overlapping portion 50 overlapping with the island-shaped structure 20.

Referring to FIG. 4 and FIG. 5, FIG. 4 is a second enlarged view of a region M in FIG. 1, and FIG. 5 is a first cross-sectional view taken along section line BB in FIG. 4. FIG. 4 and FIG. 5 are structural diagrams showing the flexible display module 100 is in a stretched state. That is, the flexible display module 100 is in a state of being touched by the user. At this time, the photosensitive structure 30 may include a second overlapping portion 60 overlapping with the island-shaped structure 20.

In the structure of FIG. 3 and FIG. 5, the flexible display module 100 includes a photosensitive functional layer 300 and a stretched functional layer 200 disposed on the photosensitive functional layer 300. The photosensitive functional layer 300 includes a plurality of photosensitive structures 30. The stretched functional layer 200 includes a plurality of island-shaped structures 20 and a first flexible adhesive layer 71 disposed between the plurality of island-shaped structures 20. The first flexible adhesive layer 71 causes the island-shaped structures 20 to move around under an action of external force.

In a structure of FIG. 3, in response to the flexible display module 10 being in the unstretched state, an orthographic projection of the first flexible adhesive layer 71 disposed between the plurality of island-shaped structures 20 on the photosensitive structures 30 is within the photosensitive structures 30. In a structure of FIG. 5, in response to the flexible display module 100 being in the stretched state, the orthographic projection of the first flexible adhesive layer 71 disposed between the plurality of island-shaped structures 20 on the photosensitive structures 30 is within the photosensitive structures 30.

Thus, in a top view of the flexible display module 100, an area of the first overlapping portion 50 in the unstretched state is greater than an area of the second overlapping portion 60 in the stretched state. The area of the overlapping portion of photosensitive structure 30 and island-shaped structure 20 is reduced. That is, a distance between two adjacent island-shaped structures 20 is increased. An area of a light guide channel 80 where the reflected light enters a space between the island-shaped structures 20 and an area of the photosensitive structures 30 to receive the reflected light are increased. A transmittance of light reflected by the ridges and valleys of the finger is improved. That is, a sensing accuracy of the fingerprint identification is improved.

Referring to FIG. 6, which is a second cross-sectional view taken along section line BB in FIG. 4. FIG. 6 is a structural diagram showing the flexible display module 100 is in the stretched state. That is, the flexible display module 100 is in a state of being touched by the user. In a case where a stretch performance of the flexible display module 100 in the present disclosure is sufficiently large, there is no overlapping portion between the photosensitive structure 30 and the island-shaped structure 20. Therefore, in response to the flexible display module 100 being in the stretched state, an orthographic projection of the photosensitive structures 30 on the stretched functional layer 200 is within the first flexible adhesive layer 71 disposed between the island-shaped structures 20.

In comparison with a structure in FIG. 5, a structure in FIG. 6 has a larger area of the light guide channel 80 between the island-shaped structures 20 and the area of the photosensitive structures 30 to receive the reflected light. The transmittance of light reflected by the ridges and valleys of the finger is higher, which further improves the sensing accuracy of the fingerprint identification.

In addition, the structure in FIG. 6 may also be the state when the flexible display module 100 is in the unstretched state. That is, the orthographic projection of the photosensitive structures 30 on the stretched functional layer 200 is within the first flexible adhesive layer 71 disposed between the island-shaped structures 20. That is, when the user does not touch the display device, there is no overlapping portion between the photosensitive structure 30 and the island-shaped structure 20. In comparison with the above structure, the area of the light guide channel 80 between the island-shaped structures 20 of this solution is further increased, and the sensing accuracy of the fingerprint identification will be further improved. However, an aperture of the corresponding light-emitting unit will decrease. Therefore, the aperture and the sensing accuracy of the fingerprint identification can be determined according to corresponding requirements.

Referring to FIG. 7, in the flexible display module 100 of the present disclosure, the photosensitive structure 30 may include a first flexible substrate 301, a photosensitive unit 302 disposed on the first flexible substrate 301, and a light filter unit 303 disposed on the photosensitive unit 302. The photosensitive unit 302 includes a first array driving layer 310 and a photosensitive device 320 disposed on the first array driving layer 310. The photosensitive device 320 includes a first cathode layer 321 electrically connected to the first array driving layer 310, a photosensitive layer 322 disposed on the first cathode layer 321, and a first anode layer 323 disposed on the photosensitive layer 322.

In this embodiment, the first anode layer 323 receives an incident light introduced by the light filter unit 303, and converts the incident light into a voltage that drives the photosensitive layer 322 to emit light.

Referring to FIG. 3, FIG. 5, and FIG. 6, the light emitted by the light-emitting unit is reflected by the user's finger toward an interior of the flexible display module 100, and is incident on a surface of the photosensitive structures 30 through the channel between the island-shaped structures 20. The first anode layer 323 of the photosensitive structures 30 receives the corresponding reflected light and converts the reflected light into a corresponding voltage signal to drive the photosensitive layer 322 of the photosensitive structures 30 to emit light. The flexible display module 100 transmits the current signal generated by the photosensitive layer 322 during a light-emitting process to a fingerprint identification processing chip to complete an optical fingerprint identification process.

The technical solutions of the present disclosure will be described below in conjunction with a specific structure and principle of the photosensitive unit 302.

In this embodiment, the first flexible substrate 301 can be made of one of polyurethane rubber, acrylic, silicone rubber, and polyimide, and has good stretchability.

In this embodiment, refer to FIG. 7, the first array driving layer 310 may include a plurality of first thin film transistors 330. The first thin film transistor 330 may be an etch stop type, a back channel etch type, or a top gate thin film transistor type structure, which is not specifically limited. For example, taking the top gate thin film transistor as an example, the first thin film transistor 330 may include a first buffer layer 331, a first active layer 332 disposed on the first buffer layer 331, a first gate insulating layer 333 disposed on the first active layer 332, a first gate layer 334 disposed on the first gate insulating layer 333, a first interlayer insulating layer 335 disposed on the first gate layer 334, a first source-drain layer 336 disposed on the first interlayer insulating layer 335, and a first planarization layer 337 disposed on the first source-drain layer 336. The first source-drain layer 336 includes a first electrode block 338 electrically connected to the first cathode layer 321.

In this embodiment, refer to FIG. 7 and FIG. 8, the first array driving layer 310 further includes a second electrode block 339 arranged on the same layer as the first gate layer 334. The first electrode block 338 and the second electrode block 339 are configured as a storage capacitor Cst. The storage capacitor Cst and the photosensitive device 320 are connected in parallel. The second electrode block 339 is electrically connected to the first anode layer 323.

In this embodiment, the first active layer 332 may be one of low temperature polysilicon, indium gallium zinc oxide, and amorphous silicon. A structure in FIG. 7 is illustrated by taking the low-temperature polysilicon as an example.

In this embodiment, a type of the photosensitive device 320 may be a photosensitive diode, an inorganic PN junction diode, or an organic photosensitive diode. Material of the first anode layer 323 may be a transparent electrode, such as indium tin oxide. The photosensitive layer 322 may be made of amorphous silicon or organic photosensitive material. The first cathode layer 321 may be made of a non-transparent metal material or other non-transparent electrode materials. In addition, the photosensitive device 320 also includes a first electron transfer layer 324 and a first hole transfer layer 325 disposed on both sides of the photosensitive layer 322. The first electron transfer layer 324 and the first hole transfer layer 325 may be made of transparent materials, such as zinc oxide and molybdenum oxide.

Referring to FIG. 8, which is an equivalent circuit diagram of the photosensitive unit 302 in FIG. 7. The photosensitive unit 302 includes the first thin film transistor 330, the photosensitive device 320 and the storage capacitor Cst. A gate of the first thin film transistor 330 is connected to a gate signal line Scan. A drain of the first thin film transistor 330 is electrically connected to a signal transmission line Data. A source of the first thin film transistor 330 is connected to the first electrode block 338 of the storage capacitor Cst and the first cathode layer 321 of the photosensitive device 320. The second electrode block 339 of the storage capacitor Cst is electrically connected to the first anode layer 323 of the photosensitive device 320.

In this embodiment, the first anode layer 323 receives the reflected light from the ridges and valleys of the finger, and converts the received light signal into a corresponding voltage signal. The voltage on the first anode layer 323 drives the photosensitive device 320 to emit light and form a corresponding current signal. The current signal is transmitted to the drain of the first thin film transistor 330 through the source of the first thin film transistor 330, and then is transmitted to the corresponding signal transmission line Data through the drain of the first thin film transistor 330, and then is transmitted to a pattern identification processing chip through the corresponding signal transmission line Data to form a fingerprint pattern, so as to complete the optical fingerprint identification process. Since the light signals reflected by the ridges and valleys of the finger are not the same, the current signals generated by the photosensitive structures 30 are also not the same, thus forming different fingerprint patterns.

In the above process, since the first anode layer 323 and the second electrode block 339 are electrically connected, the storage capacitor Cst is simultaneously charged while the first anode layer 323 receives the reflected light. That is, when the photosensitive unit 302 performs a photosensitive recognition, the storage capacitor Cst and the photosensitive device 320 form a corresponding discharge circuit. The storage capacitor Cs increases a capacitance of the photosensitive unit 302, thereby reducing a voltage drop on the first cathode layer 321. Thus, an accuracy of the fingerprint identification processing chip to obtain the corresponding voltage signal is improved, and a sensing accuracy of the optical fingerprint identification is further improved.

In this embodiment, only when the flexible display module 100 needs to perform the fingerprint identification, the gate signal line Scan will transmit the corresponding gate signal line to drive the gate of the first thin film transistor 330 to be turned on. That is, the photosensitive structures 30 will only start to work when the flexible display module 100 needs to perform the fingerprint identification.

Referring to FIG. 3, FIG. 5 and FIG. 6, in the flexible display module 100 of the present disclosure, the light filter unit 303 includes one of a red light filter unit, a green light filter unit, and a blue light filter unit. The light emitted by the light-emitting unit is light with three colors of red, green and blue. Different colors of light have different wavelengths. Thus, if white light is used for sensing, a corresponding sensing accuracy will be reduced. The light filter unit 303 of the present disclosure is a single-color light filter unit 303. For example, the light filter unit 303 is a green light filter unit, and the green light emitted by the light-emitting unit will be received by the photosensitive unit 302, and other light will be filtered out. In the present disclosure, light of the same color is introduced into the photosensitive unit 302, which improves the sensing accuracy of the optical fingerprint identification.

In the flexible display module 100 of the present disclosure, a distribution density of the photosensitive structures 30 and a distribution density of the island-shaped structures 20 may be the same. Referring to FIG. 1 to FIG. 6, the photosensitive structure 30 is disposed between four island-shaped structures 20 arranged in a triangular arrangement. The distribution density of the photosensitive structures 30 is the same as the distribution density of the island-shaped structures 20, so that the photosensitive structures 30 can disposed on anywhere in the display area of the flexible display module 100. A fingerprint identification function of the flexible display module 100 on any place of the display area is realized, and the full-screen fingerprint identification is realized. Secondly, due to the stretchability or bending performance of the flexible display module 100, corresponding photosensitive structures 30 can also be set on a bending portion of some displays.

In the flexible display module 100 of the present disclosure, FIG. 9 and FIG. 10 are partial cross-sectional views of the flexible display module. The flexible display module includes an island-shaped structure region 241, a flexible filling region 242, and a flexible adhesive layer region 243.

In this embodiment, the island-shaped structures 20 in the island-shaped structure region 241 may include a second flexible substrate 201, a second array driving layer 202 disposed on the second flexible substrate 201, and a light-emitting functional layer 220 disposed on the second flexible substrate 201. The second flexible substrate 201, the second array driving layer 202, and the light-emitting functional layer 220 are patterned. The light guide channel 80 is formed between two adjacent island-shaped structures 20. The light guide channel 80 is filled with the first flexible adhesive layer 71.

In this embodiment, material of the second flexible substrate 201 can be the same as material of the first flexible substrate 301, as long as it has good stretchability.

In this embodiment, the second array driving layer 202 may include a plurality of second thin film transistors 210. The second thin film transistor 210. may be an etch stop type, a back channel etch type, or a top gate thin film transistor type structure, which is not specifically limited. For example, taking the top gate thin film transistor as an example, the second thin film transistor 210 may include a second buffer layer 211, a second active layer 212 disposed on the second buffer layer 211, a second gate insulating layer 213 disposed on the second active layer 212, a second gate layer 214 disposed on the second gate insulating layer 213, a second interlayer insulating layer 215 disposed on the second gate layer 214, a second source-drain layer 216 disposed on the second interlayer insulating layer 215, and a second planarization layer 217 disposed on the second source-drain layer 216.

In this embodiment, the above-mentioned top gate thin film transistor is not limited to a single gate structure, and can also be configured as a double gate structure or the like.

In this embodiment, the second active layer 212 may be one of low-temperature polysilicon, indium gallium zinc oxide, and amorphous silicon. Structures in in FIG. 9 and FIG. 10 are illustrated by taking indium gallium zinc oxide as an example.

In this embodiment, the light-emitting functional layer 220 includes a plurality of the light-emitting units, and the light-emitting unit may be an organic light emitting diode (OLED) or a micro-light-emitting diode (micro-LED).

In the structure of FIG. 9, the light-emitting functional layer 220 may include a second anode layer 221, a second luminescent material layer 222 disposed on the second anode layer 221, and a second cathode layer 223 disposed on the second luminescent material layer 222. The second anode layer 221 is electrically connected to a second source-drain layer 216. In this embodiment, material of the second anode layer 221 and material of the second cathode layer 223 may be, but not limited to, metal or metal oxide.

In the structure of FIG. 10, the light-emitting functional layer 220 may include a first metal layer and a micro-LED 231 disposed on the first metal layer. The first metal layer may include a first electrode 232 and a second electrode 233 that are insulated. The first electrode 232 electrically connects the second source-drain layer 216 with a P-type electrode of the micro-LED. The second electrode 233 is electrically connected to an N-type electrode of the micro-LED.

In the above-mentioned structures of FIG. 9 and FIG. 10, the stretched functional layer 200 further includes a second flexible adhesive layer 72 disposed on both sides of the plurality of island-shaped structures 20. The first flexible adhesive layer 71 and the second flexible adhesive layer 72 can be integrated. The plurality of island-shaped structures 20 are embedded in the flexible protective layer 70 configured by the first flexible adhesive layer 71 and the second flexible adhesive layer 72.

In this embodiment, material of the flexible protective layer 70 may be a stretchable plastic such as transparent optical glue.

In the present disclosure, the integrated flexible protective layer 70 is disposed on both sides of the stretched functional layer 200 and between two adjacent island-shaped structures 20 to ensure that display structures in the flexible display module 100 are encapsulated in all directions. At the same time, the setting of the flexible adhesive layer enables the flexible display module 100 to achieve spatial multi-dimensional stretching and deformation.

In the flexible display module 100 of the present disclosure, the stretched functional layer 200 further includes a flexible encapsulation layer 90 disposed on at least one side of the second flexible adhesive layer 72. Material of the flexible encapsulation layer 90 may include polydimethylsiloxane.

In the structure of FIG. 3, the stretched functional layer 200 further includes a layer of the flexible encapsulation layer 90. The flexible encapsulation layer 90 is disposed on the second flexible adhesive layer 72 on a side of the flexible display module 100 away from the photosensitive structures 30. In the structure of FIG. 5, the stretched functional layer 200 further includes two layers of the flexible encapsulation layer 90. The two flexible encapsulation layers 90 are respectively disposed on one side of two second flexible adhesive layer 72. That is, the two flexible encapsulation layers 90, the two second flexible adhesive layers 72, and the display structures in the middle form a sandwich structure to further protect the flexible display module 100.

In the present disclosure, the light guide channel 80 is formed in a center of island-shaped structures 20 arranged in a triangular arrangement. The light guide channel 80 is filled with a transparent plastic material such as an optical adhesive having permeability and stretchability, and the display structures are covered, so that the display structures is filled in the flexible material. In addition, the setting of the light guide channel 80 utilizes a principle of small hole imaging, so that the reflected light in a larger angle range is introduced into the photosensitive structures 30 through the light guide channel 80 with a smaller angle. Thus, an interference of a mechanism is avoided, an interference between two adjacent photosensitive structures 30 is reduced, and the accuracy of the optical fingerprint identification is improved.

Referring to FIG. 11, in the flexible display module 100 of the present disclosure, the light-emitting unit may include a first color sub-pixel 41, a second color sub-pixel 42, and a third color sub-pixel 43. Light-emitting areas of the first color sub-pixel 41, the second color sub-pixel 42, and the third color sub-pixel 43 are equal.

Referring to FIG. 12, the light-emitting unit may include a first color sub-pixel 41, a second color sub-pixel 42, and a third color sub-pixel 43. An area of the third color sub-pixel 43 is larger than an area of the first color sub-pixel 41 or an area of the second color sub-pixel 42.

In this embodiment, the first color sub-pixel 41 is a red sub-pixel. The second color sub-pixel 42 is a green sub-pixel. The third color sub-pixel 43 is a blue sub-pixel. Due to inherent characteristics of luminescent materials, a luminous efficiency and luminous lifespan of the luminescent materials in the red luminous sub-pixel, the green luminous sub-pixel, and the blue luminous sub-pixel are all different. The green luminescent material has the best luminous lifespan and luminous efficiency, and blue luminescent material has the worst luminous lifespan and luminous efficiency. Therefore, when the areas are determined, the light-emitting area of the blue light-emitting sub-pixel is the largest, and the light-emitting area of the green light-emitting sub-pixel is the smallest.

Referring to FIG. 13, in the flexible display module 100 of the present disclosure, the light-emitting units include a first sub-pixel R, a second sub-pixel G, a third sub-pixel B1, and a fourth sub-pixel B2. The first sub-pixel R corresponds to the first color sub-pixel 41. The second sub-pixel G corresponds to second color sub-pixel 42. The third sub-pixel B1 and the fourth sub-pixel B2 correspond to the third color sub-pixel 43. That is, the first color sub-pixel 41 is the red sub-pixel, the second color sub-pixel 42 is the green sub-pixel, and the third color sub-pixel 43 is the blue sub-pixel.

In this embodiment, an area of the first sub-pixel R, an area of the second sub-pixel G, an area of the third sub-pixel B1, and an area of the fourth sub-pixel B2 may be the same. In this way, the light-emitting area of the blue sub-pixel can be larger than that of the red sub-pixel and the green sub-pixel area.

In this embodiment, a structural shape of the light-emitting unit may include, but is not limited to, a square, a rhombus, a rectangle, a circle, a polygon, and other structures.

Referring to FIG. 14, in the flexible display module 100 of the present disclosure, the plurality of electrical connection structures 10 may include a plurality of bending structures. The bending structures include at least a first bending portion 110 and a second bending portion 120. One end of the first bending portion 110 is electrically connected to a first island-shaped structure 251. The other end of the first bending portion 110 is electrically connected to one end of the second bending portion 120. The other end of the second bending portion 120 is electrically connected to a second island-shaped structure 252. The first island-shaped structure 251 is adjacent to the second island-shaped structure 252. A bending direction of the first bending portion 110 and a bending direction of the second bending portion 120 are different.

Referring to FIG. 2, the plurality of bending structures electrically connect any two adjacent island-shaped structures 20. Under an action of external force, the bending structures can be transformed from a bending state to a linear state. That is, when the light guide channel 80 between two adjacent island-shaped structures 20 becomes larger, the bending structures is transformed to the linear state. Secondly, when the flexible display module 100 is stretched under the action of external force in horizontal and vertical directions, each bending structure is deformed along the direction of the external force. The bending structure can be elastically deformed in a plane space position in a form of force similar to a spring, and a total length is changed. That is, in the corresponding force direction, the structure is stretched and deformed, and an overall length becomes longer. Since the plurality of bending structures can be set between two adjacent island-shaped structures 20, when being stretched, each bending structure simultaneously undergoes different degrees of deformation. At the same time, it presents an extended state to achieve the effect of coordinated stretching and deformation, so that the flexible display module 100 has good stretchable mechanical properties.

Referring to FIG. 9 and FIG. 10, the bending structure may include the second flexible substrate 201, The flexible filling layer 130 disposed on the second flexible substrate 201, a wiring layer 400 disposed on the flexible filling layer 130, the second planarization layer 217 disposed on the wiring layer 400, and the second flexible adhesive layer 72 disposed on the second planarization layer 217.

In this embodiment, the wiring layer 400 includes at least a plurality of metal lines, and two adjacent metal lines are arranged in parallel and equidistantly.

In this embodiment, the flexible filling layer 130 is filled with a flexible organic material.

In the flexible display module 100 of the present disclosure, the plurality of metal lines include at least a data line, a gate line, a driving voltage line, and a voltage transmission line.

The present disclosure also provides a display terminal. The display terminal includes a terminal body and the above-mentioned flexible display module. The terminal body and the flexible display module are assembled as one piece. A working principle of the display terminal is similar to a working principle of the flexible display module. The display terminal may include, but is not limited to, mobile phones, tablet computers, computer displays, game consoles, televisions, display screens, wearable devices, and other domestic appliances or household appliances with display functions.

The present disclosure provides the flexible display module and the display terminal. The flexible display module includes the plurality of island-shaped structures, the plurality of electrical connection structures, and the plurality of photosensitive structures. Two adjacent island-shaped structures are stretched and connected by the plurality of electrical connection structures. Each of the photosensitive structures is disposed between two adjacent island-shaped structures, and the photosensitive structures are disposed on one side of the island-shaped structures away from a light-emitting direction of the flexible display module. In the present disclosure, the photosensitive structure is disposed between two adjacent light-emitting units, so that the photosensitive structures are arranged according to an arrangement of the light-emitting units. It is ensured that the photosensitive structures are corresponding disposed on anywhere in the display area, and the full-screen arrangement of a fingerprint identification structure is realized.

It can be understood that for those of ordinary skill in the art, equivalent replacements or changes can be made according to the technical solutions of the present disclosure and its inventive concept. All these changes or replacements shall fall within the protection scope of the appended claims of the present disclosure.

What is claimed is:

1. A flexible display module, comprising:

a plurality of island-shaped structures, wherein each of the island-shaped structures comprises a light-emitting unit, and the plurality of island-shaped structures are separated from each other;

a plurality of electrical connection structures, wherein the electrical connection structures comprise metal lines configured to electrically connect the light-emitting units, and two adjacent island-shaped structures are stretched and connected by the plurality of electrical connection structures; and a plurality of photosensitive structures, wherein each of the photosensitive structures is disposed between two adjacent island-shaped structures, and the photosensitive structures are disposed on one side of the island-shaped structures away from a light-emitting direction of the flexible display module.

2. The flexible display module according to claim 1, wherein in response to the flexible display module being in an unstretched state, the photosensitive structure comprises a first overlapping portion overlapping with the island-shaped structure;

in response to the flexible display module being in a stretched state, the photosensitive structure comprises a second overlapping portion overlapping with the island-shaped structure; and in a top view of the flexible display module, an area of the first overlapping portion is greater than an area of the second overlapping portion.

3. The flexible display module according to claim 1, further comprising a photosensitive functional layer and a stretched functional layer disposed on the photosensitive functional layer, wherein the photosensitive functional layer comprises the plurality of photosensitive structures, and the stretched functional layer comprises the plurality of island-shaped structures and a first flexible adhesive layer disposed between the plurality of island-shaped structures;

in response to the flexible display module being in an unstretched state, an orthographic projection of the first flexible adhesive layer disposed between the plurality of island-shaped structures on the photosensitive structures is within the photosensitive structures, or in response to the flexible display module being in the unstretched state, an orthographic projection of the photosensitive structures on the stretched functional layer is within the first flexible adhesive layer between the plurality of island-shaped structures; and in response to the flexible display module being in a stretched state, the orthographic projection of the first flexible adhesive layer disposed between the plurality of island-shaped structures on the photosensitive structures is within the photosensitive structures, or in response to the flexible display module being in the stretched state, the orthographic projection of the photosensitive structures on the stretched functional layer is within the first flexible adhesive layer between the plurality of island-shaped structures.

4. The flexible display module according to claim 3, wherein the photosensitive structure comprises a first flexible substrate, a photosensitive unit disposed on the first flexible substrate, and a light filter unit disposed on the photosensitive unit; and the photosensitive unit comprises a first array driving layer and a photosensitive device disposed on the first array driving layer, the photosensitive device comprises a first cathode layer, a photosensitive device, and a first anode layer, the first cathode layer is electrically connected to the first array driving layer, the photosensitive device is disposed on the first cathode layer, the first anode layer is disposed on the photosensitive layer.

5. The flexible display module according to claim 4, wherein the first array driving layer further comprises a first active layer, a first gate layer disposed on the first active layer, and a first source-drain layer disposed on the first gate layer, and the first source-drain layer comprises a first electrode block electrically connected to the first cathode layer;

the first array driving layer further comprises a second electrode block arranged on a same layer as the first gate layer, and the first electrode block and the second electrode block are configured as a storage capacitor; and the storage capacitor is connected in parallel with a light reflecting device, and the second electrode block is electrically connected with the first anode layer.

6. The flexible display module according to claim 4, wherein the light filter unit comprises one of a red light filter unit, a green light filter unit, and a blue light filter unit.

7. The flexible display module according to claim 3, wherein the stretched functional layer further comprises a second flexible adhesive layer disposed on both sides of the plurality of island-shaped structures, and the first flexible adhesive layer and the second flexible adhesive layer are integrated; and the plurality of island-shaped structures are embedded in a flexible protective layer configured by the first flexible adhesive layer and the second flexible adhesive layer.

8. The flexible display module according to claim 4, wherein the island-shaped structure comprises:

a second flexible substrate;

a second array driving layer disposed on the second flexible substrate; and a light-emitting functional layer disposed on the second array driving layer, wherein the light-emitting functional layer comprises a plurality of the light-emitting units, and the light-emitting units are electrically connected to sources and drains in the second array driving layer.

9. The flexible display module according to claim 8, wherein the stretched functional layer further comprises a flexible encapsulation layer disposed on at least one side of the second flexible adhesive layer, and material of the flexible encapsulation layer comprises polydimethylsiloxane.

10. The flexible display module of claim 3, wherein a distribution density of the photosensitive structures and a distribution density of the island-shaped structures are the same.

11. The flexible display module according to claim 1, wherein the plurality of electrical connection structures comprises a plurality of bending structures, the bending structures comprise at least a first bending portion and a second bending portion, one end of the first bending portion is electrically connected to a first island-shaped structure, another end of the first bending portion is electrically connected to one end of the second bending portion, and another end of the second bending portion is electrically connected to a second island-shaped structure, and wherein the first island-shaped structure is adjacent to the second island-shaped structure; and a bending direction of the first bending portion is different from a bending direction of the second bending portion.

12. The flexible display module according to claim 1, wherein the light-emitting unit comprises a first color sub-pixel, a second color sub-pixel, and a third color sub-pixel, and an area of the third color sub-pixel is greater than an area of the first color sub-pixel or an area of the second color sub-pixel.

13. The flexible display module according to claim 1, wherein the light-emitting unit comprises a first sub-pixel, a second sub-pixel, a third sub-pixel, and a fourth sub-pixel, the first sub-pixel corresponds to a first color sub-pixel, the second sub-pixel corresponds to a second color sub-pixel, and the third sub-pixel and the fourth sub-pixel correspond to a third color sub-pixel.

14. The flexible display module according to claim 1, further comprising a bending structure, wherein the bending structure comprises:

a second flexible substrate;

a flexible filling layer disposed on the second flexible substrate;

a wiring layer disposed on the flexible filling layer; and a second flexible adhesive layer disposed on the wiring layer;

wherein the wiring layer comprises at least a plurality of metal lines, and two adjacent metal lines are arranged in parallel and equidistantly.

15. The flexible display module according to claim 14, wherein the plurality of metal lines comprise at least a data line, a gate line, a driving voltage line, and a voltage transmission line.

16. A display terminal, comprising a terminal body and a flexible display module, wherein the terminal body and the flexible display module are assembled as one piece, and the flexible display module comprises:

a plurality of island-shaped structures, wherein each of the island-shaped structures comprises a light-emitting unit, and the plurality of island-shaped structures are separated from each other;

a plurality of electrical connection structures, wherein the electrical connection structures comprise metal lines configured to electrically connect the light-emitting units, and two adjacent island-shaped structures are stretched and connected by the plurality of electrical connection structures; and a plurality of photosensitive structures, wherein each of the photosensitive structures is disposed between two adjacent island-shaped structures, and the photosensitive structures are disposed on one side of the island-shaped structures away from a light-emitting direction of the flexible display module.

17. The display terminal according to claim 16, wherein in response to the flexible display module being in an unstretched state, the photosensitive structure comprises a first overlapping portion overlapping with the island-shaped structure;

in response to the flexible display module being in a stretched state, the photosensitive structure comprises a second overlapping portion overlapping with the island-shaped structure; and in a top view of the flexible display module, an area of the first overlapping portion is greater than an area of the second overlapping portion.

18. The display terminal according to claim 16, wherein the flexible display module further comprises a photosensitive functional layer and a stretched functional layer disposed on the photosensitive functional layer, the photosensitive functional layer comprises the plurality of photosensitive structures, and the stretched functional layer comprises the plurality of island-shaped structures and a first flexible adhesive layer disposed between the plurality of island-shaped structures;

in response to the flexible display module being in an unstretched state, an orthographic projection of the first flexible adhesive layer disposed between the plurality of island-shaped structures on the photosensitive structures is within the photosensitive structures, or in response to the flexible display module being in the unstretched state, an orthographic projection of the photosensitive structures on the stretched functional layer is within the first flexible adhesive layer between the plurality of island-shaped structures; and in response to the flexible display module being in a stretched state, the orthographic projection of the first flexible adhesive layer disposed between the plurality of island-shaped structures on the photosensitive structures is within the photosensitive structures, or in response to the flexible display module being in the stretched state, the orthographic projection of the photosensitive structures on the stretched functional layer is within the first flexible adhesive layer between the plurality of island-shaped structures.

19. The display terminal according to claim 18, wherein the photosensitive structure comprises a first flexible substrate, a photosensitive unit disposed on the first flexible substrate, and a light filter unit disposed on the photosensitive unit; and the photosensitive unit comprises a first array driving layer and a photosensitive device disposed on the first array driving layer, the photosensitive device comprises a first cathode layer, a photosensitive device, and a first anode layer, the first cathode layer is electrically connected to the first array driving layer, the photosensitive device is disposed on the first cathode layer, the first anode layer is disposed on the photosensitive layer.

20. The display terminal according to claim 18, wherein the stretched functional layer further comprises a second flexible adhesive layer disposed on both sides of the plurality of island-shaped structures, and the first flexible adhesive layer and the second flexible adhesive layer are integrated; and the plurality of island-shaped structures are embedded in a flexible protective layer configured by the first flexible adhesive layer and the second flexible adhesive layer.

* * * * *